United States Patent
Chetta et al.

(12)

(10) Patent No.: US 6,587,741 B1
(45) Date of Patent: Jul. 1, 2003

(54) METHOD AND SYSTEM FOR DESIGNING A SPLINE COUPLING

(75) Inventors: Gregory E. Chetta, Palm Beach Gardens, FL (US); John J. Marra, Glastonbury, CT (US); Donna R. Dickerson, Jupiter, FL (US)

(73) Assignee: United Technologies Corporation, Hartford, CT (US)

(*) Notice: Subject to any disclaimer, the term of this patent is extended or adjusted under 35 U.S.C. 154(b) by 0 days.

(21) Appl. No.: 09/520,085

(22) Filed: Mar. 7, 2000

(51) Int. Cl.[7] .......................... G06F 19/00; G06F 17/50
(52) U.S. Cl. ...................... 700/97; 700/104; 700/117; 703/1; 706/919
(58) Field of Search ..................... 700/96–98, 103–105, 700/182, 117; 703/1, 7, 8; 706/45, 46, 11, 919, 904

(56) References Cited

U.S. PATENT DOCUMENTS 5,297,054 A * 3/1994 Kienzle et al. ............. 700/182
5,799,293 A * 8/1998 Kaepp ......................... 706/45
6,230,066 B1 * 5/2001 Sferro et al. ................ 700/104

* cited by examiner

Primary Examiner—Leo Picard
Assistant Examiner—Steven R. Garland (57) ABSTRACT

A method and a system for designing a spline coupling, comprising the steps of creating signals representing a spline coupling knowledge base of information having a plurality of rule signals with respect to a corresponding plurality of parameter signals of associated elements of the spline coupling, wherein the spline coupling knowledge base comprises at least one data value signal for each one of the plurality of rule signals. Included are the steps of entering a desired data value signal for a selected one of the plurality of parameter signals of an associated element of the spline coupling, and comparing the entered desired data value signal for the selected one of the plurality of parameter signals with the corresponding at least one data value signal in the spline coupling knowledge base for the corresponding one of the plurality of rule signals. The steps also include creating signals representative of a geometric representation of the selected one of the plurality of parameter signals of the associated element of the spline coupling if the result of the step of comparing is such that the entered desired data value signal for the selected one of the plurality of parameter signals is determined to have a first predetermined relationship with respect to the corresponding at least one data value signal in the spline coupling knowledge base for the selected one of the plurality of rule signals.

22 Claims, 8 Drawing Sheets

METHOD AND SYSTEM FOR DESIGNING A SPLINE COUPLING

CROSS REFERENCE TO RELATED APPLICATIONS

Some of the subject matter disclosed herein is related to the subject matter of commonly owned U.S. patent applications and patents: Ser. No. 09/212,923, filed on Dec. 16, 1998, now abandoned, entitled "Method of Creating a Parametric Model in a CAD System"; U.S. Pat. No. 6,393,331, issued on May 21, 2002, entitled "Method of Designing a Turbine Blade Outer Air Seal"; Ser. No. 09/517,567, filed on Mar. 2, 2000, entitled "Method and System for Designing an Impingement Film Floatwall Panel System"; Ser. No. 09/511,549, filed on Feb. 23, 2000, entitled "Method and System for Designing a Low Pressure Turbine Shaft"; and Ser. No. 09/608,620, filed on Jun. 30, 2000, entitled "Method and System for Designing Frames and Cases". All of the foregoing patent applications and patents are hereby incorporated by reference.

FIELD OF THE INVENTION

This invention relates generally to computer-based methods and systems for designing products, and more particularly to a computer-based method and system for designing a spline coupling.

BACKGROUND OF THE INVENTION

Splined couplings are most generally used in three types of applications: for coupling shafts when relatively heavy torque is to be transmitted without slippage, such between turbines and fans of gas turbine engines; for transmitting power to slidably-mounted or permanently-fixed gears, pulley and other rotating members, such from turbines to gas turbine engine fans; and for attaching parts that may require disassembly and removal. A spline is any of a series of projections on a shaft that fit into slots on a corresponding shaft, enabling both to rotate together. An external spline includes several projections formed on the shaft, and an internal spline includes the projections formed on the corresponding shaft or a mating bore. A spline coupling consists of mated splines which permit the transmission of rotation or translatory motion along the axis of the shaft, and which may also prevent the shaft and bore from slipping longitudinally, as well as axially.

The design of mated splines involves many factors and is difficult and time consuming. Many factors must be taken into account, including the shape of the spline teeth. For instance, while splines may have straight-sided teeth, splines with teeth having an involute shape have greater torque-transmitting capacity. Other common spline coupling design factors include the number of teeth in the spline, the closeness of fit of the splines, and pressure angles of the teeth. To make the design of splines easier, involute splines may be designed using ANSI (American National Standards Institute) tables and S.A.E. (Society of Automotive Engineers) tables which are calculated using the above spline coupling design specifications. However, the above tables do not contain specifications for the design of all couplings needed between a shaft and a bore. For example, if more teeth are required in the spline than are listed in a table, or a tooth pressure angle is employed which is not specified in a table, then spline equations must be used to generate the appropriate spline coupling design.

Other design factors for a spline coupling include weight, material characteristics, and performance requirements, such as torque transmission. In the aeronautics field, among others, weight is an extremely important design consideration. The ANSI and S.A.E. tables do not take into account the weight or durability of materials which form splines and spline couplings. In addition, the spline coupling may be required to fit within a limited space, such as between components of a gas turbine engine, or be subject to other configuration limitations. Spline coupling designs, especially in the aeronautics field, cannot be limited to particular predefined table selections, but must be optimized to meet predetermined performance and configuration requirements.

A method and system for designing a spline coupling is needed which is not limited to ANSI or S.A.E. tables, minimizes weight, includes material characteristics, and satisfies performance requirements. The spline coupling design method and system should be able to be used with other design applications, such as designing a low pressure turbine shaft for a gas turbine engine.

It is known to design various products using a computer-aided design ("CAD") system, a computer-aided manufacturing ("CAM") system, and/or a computer-aided engineering ("CAE") system. For sake of convenience, each of these similar types of systems is referred to hereinafter as a CAD system. A CAD system is a computer-based product design system implemented in software executing on a workstation. A CAD system allows the user to develop a product design or definition through development of a corresponding product model. The model is then typically used throughout the product development and manufacturing process. An example is the popular Unigraphics system commercially available from Unigraphics Solutions, Inc. (hereinafter "Unigraphics").

In addition to CAD systems, there is another type of computer-based product design system which is known as a "Knowledge-Based Engineering" ("KBE") system. A KBE system is a software tool that enables an organization to develop product model software, typically object-oriented, that can automate engineering definitions of products. The KBE system product model requires a set of engineering rules related to design and manufacturing, a thorough description of all relevant possible product configurations, and a product definition consisting of geometric and non-geometric specifications which unambiguously define a product. An example is the popular ICAD system commercially available from Knowledge Technologies, Inc. KBE systems are a complement to, rather than a replacement for, CAD systems.

An ICAD-developed program is object-oriented in the sense that the overall product model is decomposed into its constituent components or features whose specifications are individually defined. The ICAD-developed programs harness the knowledge base of an organization's resident experts in the form of design and manufacturing rules and best practices relating to the product to be designed. An ICAD product model software program facilitates rapid automated engineering product design, thereby allowing high quality products to get to market quicker.

The ICAD system allows the software engineer to develop product model software programs that create parametric, three-dimensional, geometric models of products to be manufactured. The software engineer utilizes a proprietary ICAD object-oriented programming language, which is based on the industry standard LISP language, to develop a product model software program that designs and manipulates desired geometric features of the product model. The product model software program enables the capturing of the engineering expertise of each product development discipline throughout the entire product design process. Included are not only the product geometry but also the product non-geometry, which includes product configuration, development processes, standard engineering methods and manufacturing rules. The resulting model configuration and specification data, which typically satisfy the model design requirements, comprise the output of the product model software program. This output, from which the actual product may be manufactured, comprises files which may consist of data representing geometric features of the product model and/or listings of data (e.g., dimensions, material, and tolerances) defining the various specifications and configuration features associated with each component or element of the product.

Also, the product model software program performs a "what if" analysis on the model by allowing the user to change model configuration and/or physical specification values and then assess the resulting product design. Other analyses may be run to assess various model features with regard to such functional characteristics as performance, durability and manufacturability. The analytical results, e.g. temperature and stress, are functional specifications that are evaluated in terms of boundaries or limits. Limits on both physical and functional specifications have been developed over time based on knowledge accumulated through past design, manufacturing, performance, and durability experience. Essentially, these specification limits comprise rules against which the proposed product model design is measured. Use of these historically developed specifications, analyses, and design procedures in this way is typically referred to as product "rule-based design" or "knowledge-based design". The rules determine whether the resulting product design will satisfy the component design requirements, such as weight, and whether the design is manufacturable, given various modern manufacturing processes. The rules for a particular product design are pre-programmed into the product model software program for that specific product.

While the ICAD system provides an excellent tool for developing software product models, it is not a replacement for an organization's primary CAD system, which maintains the product model definition throughout the entire product design and manufacturing cycle. This is because the ICAD system is a KBE software development tool rather than a CAD system. For example, while the ICAD system can create a geometric model, it cannot easily create drawings based on that model or support other aspects of the design process typically provided by CAD systems.

Another inherent problem with the commercial ICAD system is that the parametric model created by the product model software program cannot be transported as a similar parametric product model into a Unigraphics CAD system. However, a parametric model in a CAD system is not necessary or useful in designing a spline coupling. The parametric model in ICAD may be transported into Unigraphics as a non-parametric model.

On the other hand, the Unigraphics CAD system has inherent problems in that not all of the parametric models created by Unigraphics are "standardized" within an organization or industry. Also, parametric models implemented in Unigraphics do not effectively implement a KBE system (similar to the ICAD system) that requires the model configuration and order of Boolean operations to vary according to design requirements. Also, a Unigraphics parametric model cannot be structured to provide specification relationships that satisfy both design and manufacturing requirements.

As a result, for designing a spline coupling, a product model developed solely in the ICAD system will suffice. However, there are other instances when it is desired to transport a parametric product model developed in the ICAD system to other systems as a corresponding parametric product model, such as for analysis.

An object of the present invention is to provide a computer-based method of creating a parametric, three-dimensional, geometric product model of a spline coupling for use in a gas turbine engine.

Another object of the present invention is to provide a computer-based method of creating a spline coupling model which minimizes the weight of the spline coupling while satisfying performance and configuration requirements.

Another object of the present invention is to provide a computer-based method of creating a parametric product model in a KBE system that can be recreated as a similar non-parametric product model in other systems.

The above and other objects and advantages of the present invention will become more readily apparent when the following description of a best mode embodiment of the present invention is read in conjunction with the accompanying drawings.

SUMMARY OF THE INVENTION

A method of designing a spline coupling, including the step of creating signals representing a spline coupling knowledge base of information having a plurality of rule signals with respect to a corresponding plurality of parameter signals of associated elements of the spline coupling, wherein the spline coupling knowledge base comprises at least one data value signal for each one of the plurality of rule signals. The method includes the steps of entering a desired data value signal for a selected one of the plurality of parameter signals of an associated element of the spline coupling, and comparing the entered desired data value signal for the selected one of the plurality of parameter signals with the corresponding at least one data value signal in the spline coupling knowledge base for the corresponding one of the plurality of rule signals. The steps also include creating signals representative of a geometric representation of the selected one of the plurality of parameter signals of the associated element of the spline coupling if the result of the step of comparing is such that the entered desired data value signal for the selected one of the plurality of parameter signals is determined to have a first predetermined relationship with respect to the corresponding at least one data value signal in the spline coupling knowledge base for the selected one of the plurality of rule signals.

A computerized system for designing a spline coupling, comprising a spline coupling knowledge base for storing a plurality of spline coupling design parameter signals corresponding to a plurality of design rule signals for creating a geometric representation of a spline coupling. The computerized system also includes selection means for receiving a parameter value signal corresponding to at least one of the design parameter signals, and processing means for comparing the parameter value signal with the at least one of the design parameter signals stored in the knowledge base. Also included is means for creating the geometric representation of the spline coupling if the parameter value signal has a first predetermined relationship with the design parameter signal and at least one of the design rule signals.

DETAILED DESCRIPTION OF THE PREFERRED EMBODIMENT

Referring to the figures in general, in an exemplary embodiment of the present invention, the invention generally comprises a method and system embodied in a knowledge-based, product model software program 10 implemented on a workstation that creates a model 20 of a spline coupling 30. The resulting product may then be manufactured from the model 20. The product model software program 10 may preferably be embodied in the aforementioned ICAD system, commercially available from Knowledge Technologies, Inc., and operating within a workstation, such as that available from Sun Microsystems or Silicon Graphics. The method of the present invention enables the rapid creation and manipulation of a parametric, three-dimensional, geometric model 20 of the spline coupling 30.

The design of a model 20 of the spline coupling 30 involves entering spline coupling configuration and performance specifications into the product model software program 10. The specifications may be entered into the product model software program 10 by a user or the specifications may be supplied by another computer program, such as a program for designing a low pressure turbine shaft for a gas turbine engine. The product model software program 10 then uses its internal knowledge base of configuration dependent specification relationships and constraints to create a valid three-dimensional, parametric model 20 of the spline coupling. The configuration specifications include quantity, position, and dimensions of spline teeth 32, snaps 34 and shoulder 36.

During product model software program 10 operation, in conformance with the algorithm of the present invention, the user enters or modifies configuration and specification data regarding various structural features of the spline coupling. This information is typically entered into the product model software program 10 using a keyboard or mouse associated with the workstation on which the product model software is implemented. The user is guided by graphical user interfaces ("GUIs") containing information provided on a visual display screen associated with the workstation. The product model software program 10 compares the input design information against a knowledge base of information stored as part of the product model software program. This determines whether any design constraints have been violated which would cause the spline coupling to not satisfy the design requirements or be non-producible using modern manufacturing techniques. If so, the model 20 is invalid. The information comprises a pre-programmed knowledge base of configuration dependent specification relationships and rules regarding acceptable durability, manufacturing and performance design limits for the spline coupling. The visual model 20 may then be manipulated by changing various specifications or attributes associated with corresponding components of the spline coupling.

One of the advantages of the product model software program 10 is that it aids a designer who is familiar with design constraints but who may not be familiar with manufacturing constraints or preferences of a particular company. The designer would have to spend a substantial amount of time looking up and learning a company's manufacturing constraints and preferences, or risk creating a design which could not be built. Even if the design could be built, it could be more expensive or heavier than necessary. The product model software program 10 eliminates this time consuming and expensive problem by including the manufacturing constraints and company preferences as part of the knowledge base.

The product model software program 10 also performs various analyses on the spline coupling model 20, such as nominal tooth bearing stress, maximal tooth bearing stress, fatigue life and the difference in torsional windup between an internal spline 38 and an external spline 40, on the spline coupling model 20. Configuration and performance specifications of the model 20 may be changed, depending upon the results of the analyses. Once creation of a valid model 20 is complete, the product model software program 10 outputs a report file containing model configuration and specification data, and an input file for an ANSYS system. Other computer programs may then use these output files in a desired manner, such as for further analysis. The product model software program 10 also creates output files for a non-parametric geometric model.

Figure 1:
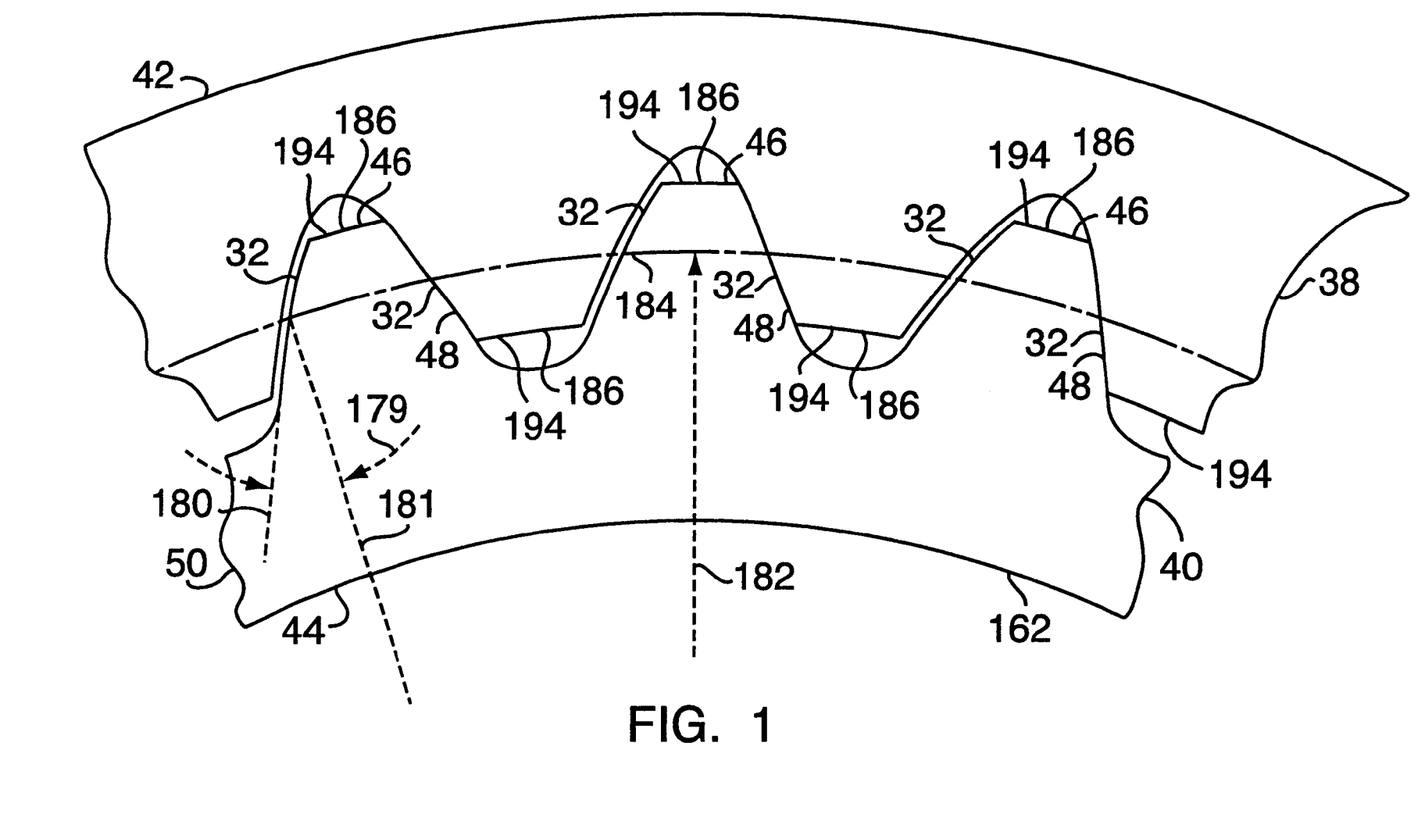
FIG. 1 is a partial, circumferential, cross sectional, schematic view of a spline coupling.

The spline coupling 30, as shown in FIG. 1, is used to join components, such as a first shaft 42 to a second shaft 44. The spline coupling 30 includes the internal spline 38 and the external spline 40. The external spline 40 is formed from the second shaft 44, and includes external spline teeth 46 which protrude away from the axis of the first shaft 42 and the second shaft. The internal spline 38 is formed from the first shaft 42 or mating bore 42, and includes internal spline teeth 48 which protrude towards the axis of the first shaft and the second shaft 44.

Specifications unique to a spline coupling 30 are pre-programmed into the spline coupling knowledge base. As mentioned above, the values of these specifications typically comprise those relating to various gaps, thickness, lengths, depths, widths, etc. These specification values should be apparent to one of ordinary skill in the art. Some or all of these specification values may be default values.

The design criteria for the spline coupling 30, especially for aeronautical design, includes an ability to operate under a specified torque load while minimizing the weight of the spline coupling. The second shaft 44 is generally cylindrical and hollow, and the shaft walls 50 are as thin as possible to minimize weight while meeting performance requirements. While a design method and system for a spline coupling is shown for use in the field of aeronautical design, the present invention is not so limited, as the design method and system for a spline coupling may be employed in other design areas, such as the field of automotive design, without departing from the broader aspects of the present invention.

Design criteria also include designing the spline coupling 30 with as large a diameter possible, while still conforming with the geometric limitations imposed by other gas turbine engine components, such as bearings and compressors. A shaft and spline of a specified diameter and thickness can transmit more torque than a smaller diameter shaft of the same thickness. For an equal torque capability, a larger diameter spline coupling is thinner and weighs less. A circumferentially larger spline may also transmit torque without effects which would distort a smaller spline or the shaft since a larger spline may spread torque over more teeth. Additional spline coupling diameter limitations are imposed by performance requirements, such as providing a designated amount of airflow around the shaft during operation of the gas turbine engine (not shown).

Figure 2:
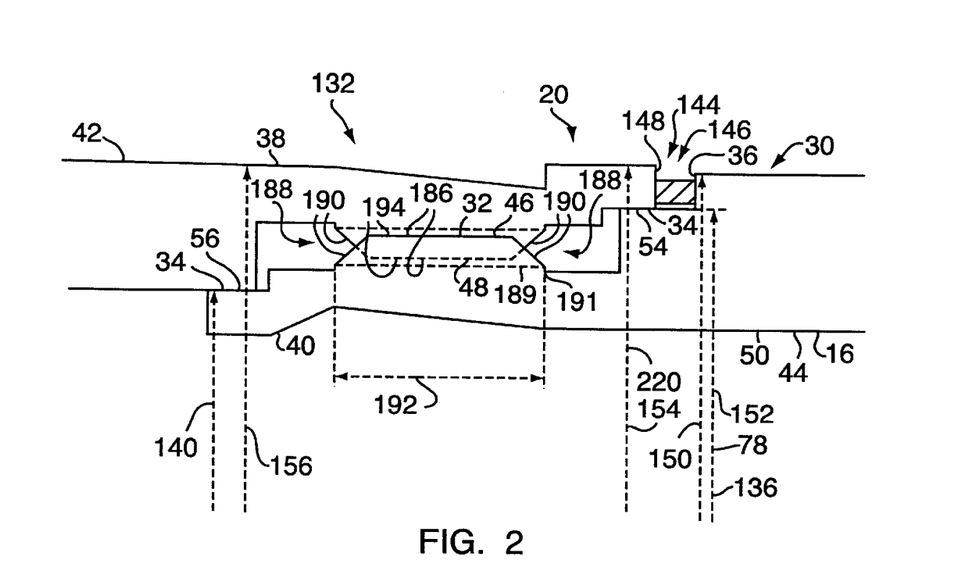
FIG. 2 is an partial, axial, cross sectional, schematic view of a second embodiment of a spline coupling.

Referring to FIG. 2, both the internal spline 38 and the external spline 44 contain a number of distinct physical structural features, such as a shoulder 36 and a major snap 54 and a minor snap 56, that may be incorporated into the corresponding spline coupling model 20 by the product model software program 10, in accordance with an exemplary embodiment of the present invention. Many types of known structural features of the spline coupling are contemplated by the system and method of the present invention, as described hereinafter.

Figure 3:
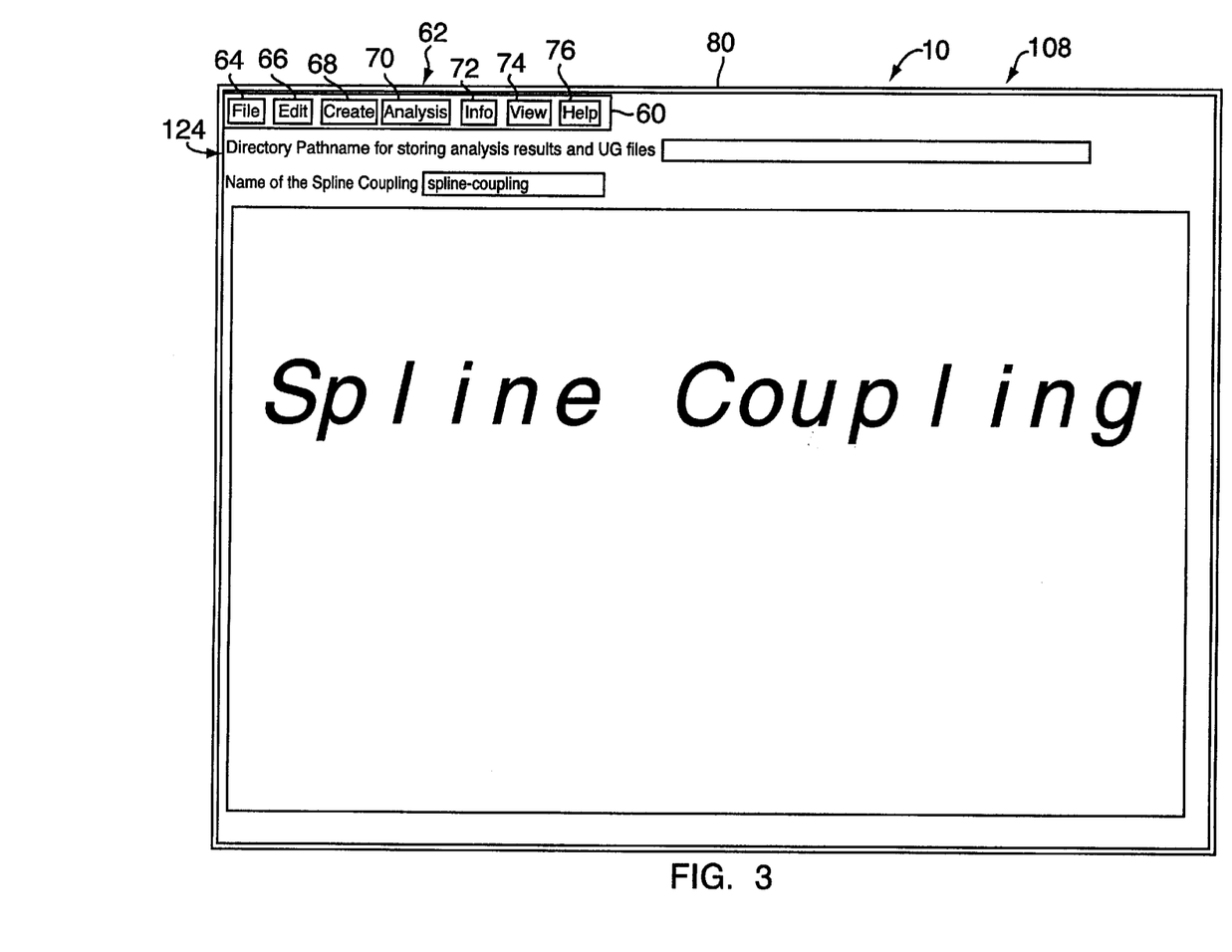
FIG. 3 is an exemplary graphical user interface displayed to the user of the product model software program illustrating a menu of operations for the product model software program of FIG. 5.

As shown in FIG. 3, in a main GUI screen 58 displayed to the user by the algorithm of the present invention embodied in the product model software program 10, the main menu 60 buttons 62 labeled File 64, Edit 66, Create 68, Analysis 70, Info 72, View 74, and Help 76, indicate logical steps for entering specifications in the design process for developing the spline coupling model 20. The user, by selecting each button 62, invokes at least one additional GUI screen for adding or modifying model 20 specifications, such as an outer diameter 78 of the external spline 40 at the major snap 54. While a logical sequence to the design process for the spline coupling model 20 has been shown, the present invention is not limited in this regard, as specifications may be modified and entered in numerous different sequences.

Figure 4:
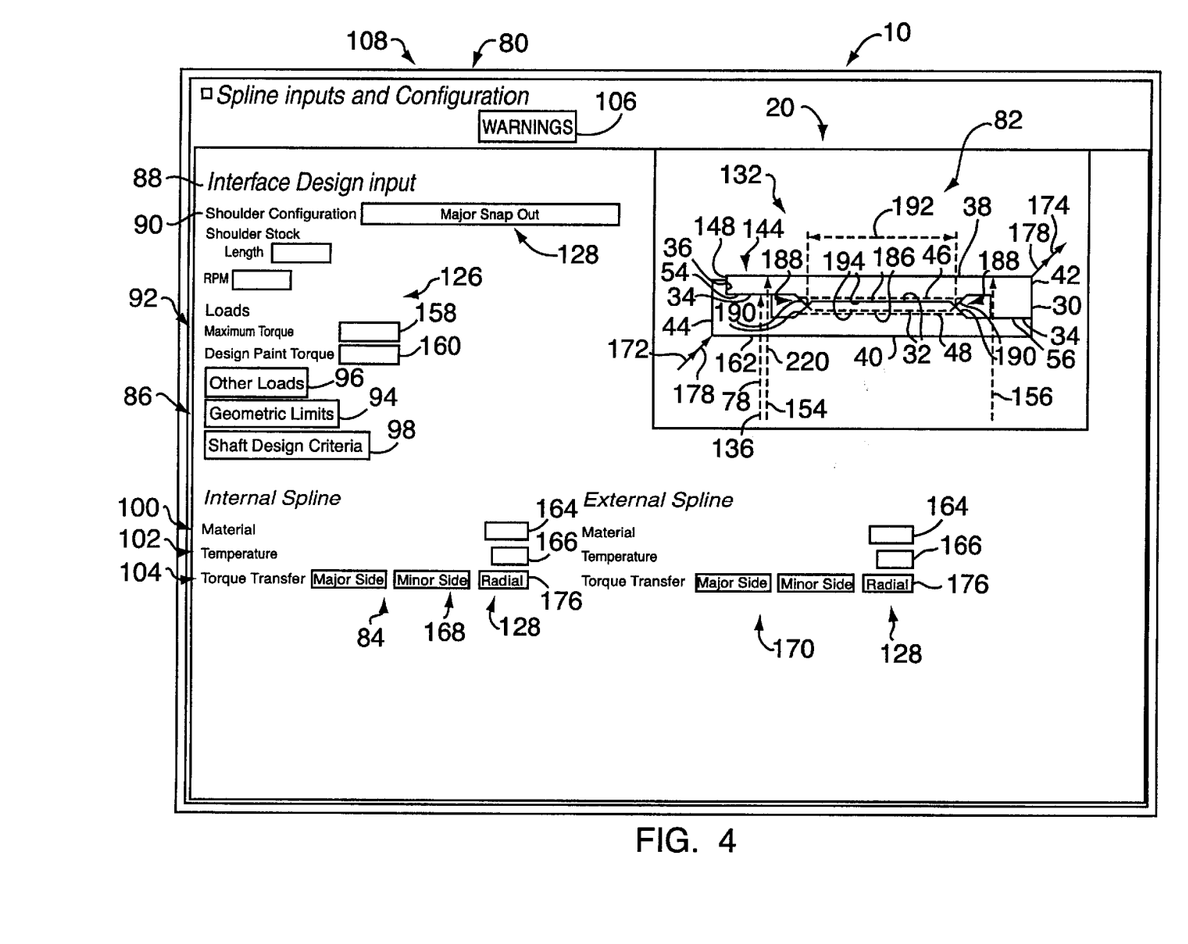
FIG. 4 is an exemplary graphical user interface displayed to the user of the product model software program illustrating an input screen for configuration and performance specifications, and displaying a spline coupling model created by the product model software program of FIG. 5.
Figure 5A:
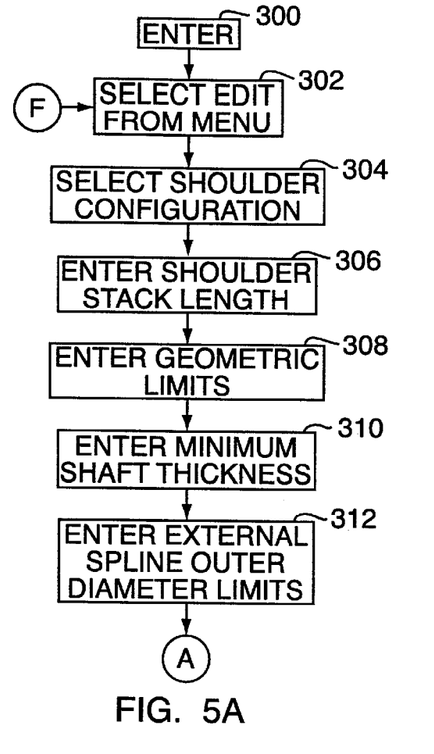
FIGS. 5A to 5E, illustrate a flow chart showing one embodiment of an algorithm performed by the product model software program in designing the model of a spline coupling in accordance with the method and system of the present invention.
Figure 5B:
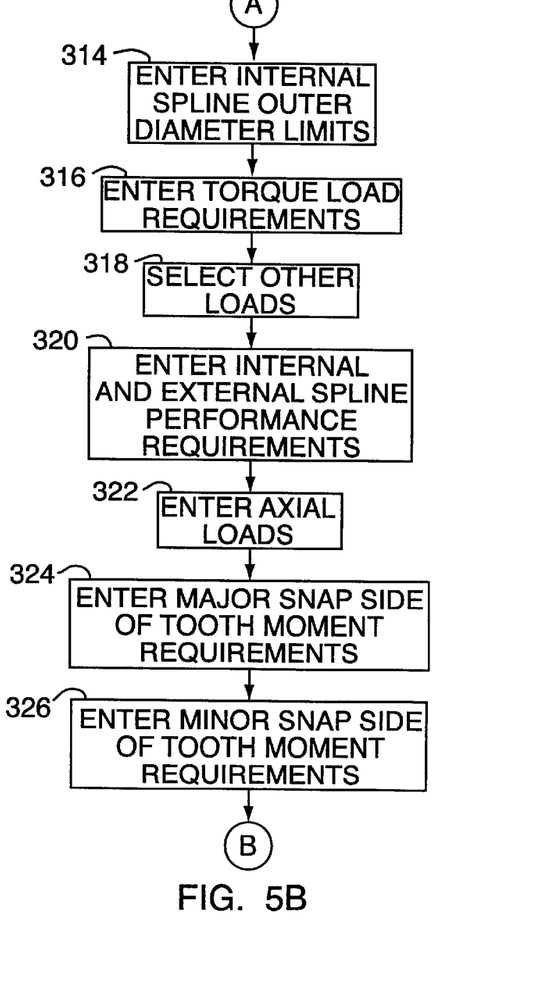
Figure 5C:
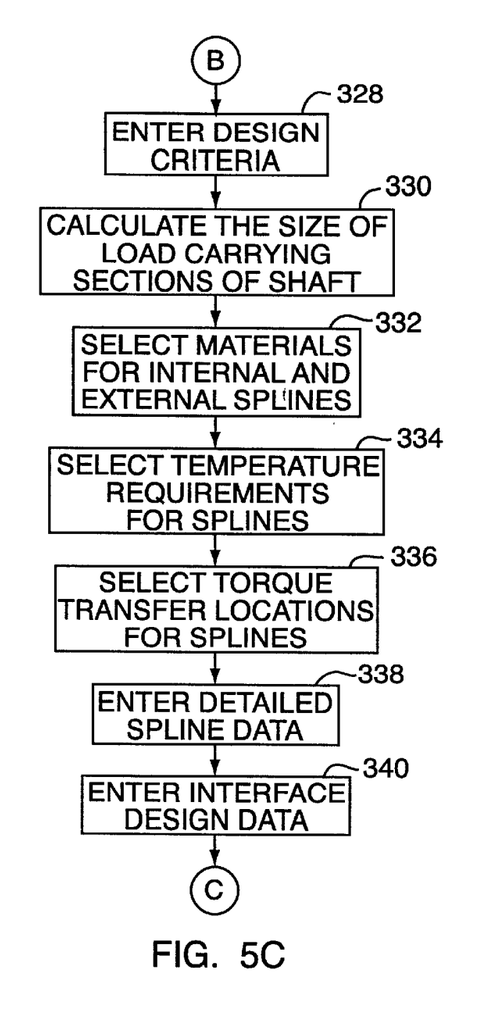
Figure 5D:
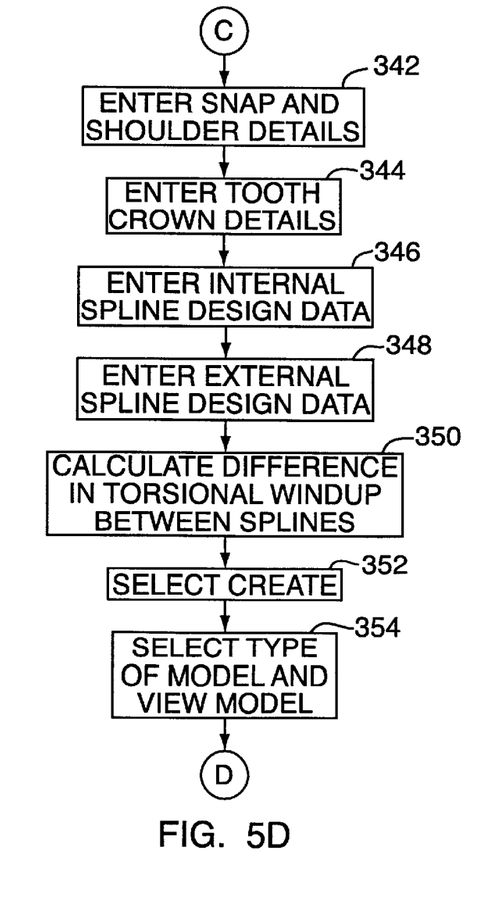
Figure 5E:
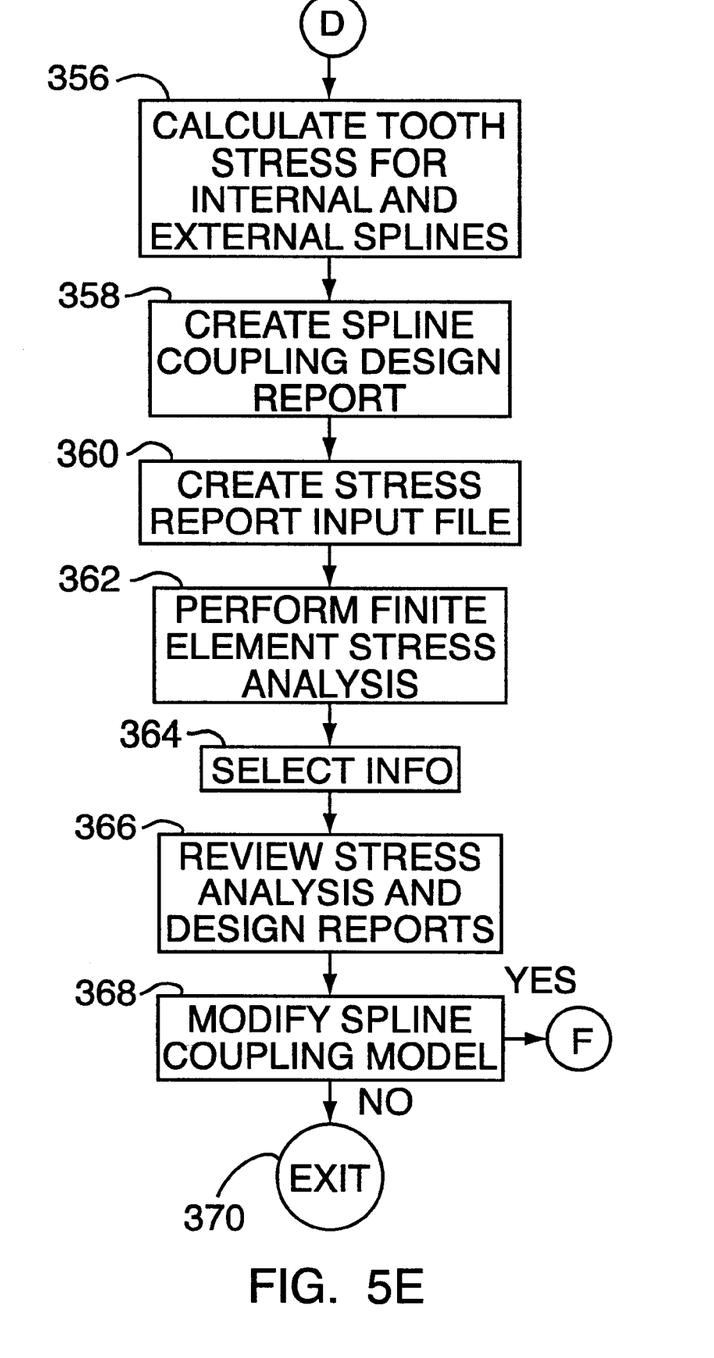

Referring to FIG. 4, a Spline Inputs and Configuration GUI screen 80, which is displayed by the product model software in response to selecting the Create button 68, displays a line drawing 82 showing a geometric representation 81 of the model 20 of the spline coupling 30. The Spline Inputs and Configuration GUI screen 80 also shows spline configuration and performance specifications 84 and user selectable buttons 86, such as a shoulder configuration specification 88, a shoulder stack length specification 90, Loads specifications 92, a Geometric Limits button 94, an Other Loads button 96, a Shaft Design Criteria button 98, and, for the internal spline 38 and the external spline 40, material specifications 100, temperature specifications 102, and torque transfer specifications 104. The arrangement of the spline coupling configuration specifications and user selectable buttons 86 displayed on the Spline Inputs and Configuration GUI screen 80 indicate an order for employing the product model software program 10 to design the spline coupling model 20.

Still referring to FIG. 4, the user, by selecting each button 86, causes the product model software program 10 to display in conformance with the algorithm of the present invention, at least one additional GUI screen for adding or modifying the spline coupling model 20 specifications, such as the outer diameter 78 of the external spline 40 at the major snap 54. While a logical sequence to the design process for the spline coupling model 20 has been shown by the arrangement of the GUI screens, the present invention is not limited in this regard, as spline coupling specifications may be modified and entered in numerous different sequences.

Continuing with FIG. 4, a Warnings button 106 may be displayed on any GUI screen 108 to notify the user that a rule has been violated. In accordance with the algorithm of the present invention, the product model software program 10 continually evaluates the validity of the spline coupling model 20. The evaluation compares specification values with performance and specification limits previously entered or calculated in accordance with the spline coupling knowledge base which is stored on the workstation. If a comparison indicates that a specification value oversteps a performance or specification limit, a warning is displayed to the user. Due to the large number of possible specification values and the complexity of the specification relationships embodied in the spline coupling knowledge base, a modification to one specification of the spline coupling model 20 may cause a warning to be displayed in regard to a violation of a rule for another specification of the spline coupling model.

The Warnings button 106 and any specifications which have violated a rule are highlighted in red on the GUI screen 108 to draw immediate notice from the user. The user may click on the Warnings button 106 using a mouse 110 or keyboard 112 to display information relating to the rule or rules which have been violated. The user decides whether the violation of the rule and the overstepping of specification limits invalidates the design of the spline coupling model 20. The user may ignore the displayed warning information and leave the Warnings button 106 and the specification affected by the warning highlighted and displayed, or the user may also modify the specification or specifications which have caused the rule violation and the display of the warning.

Figure 6:
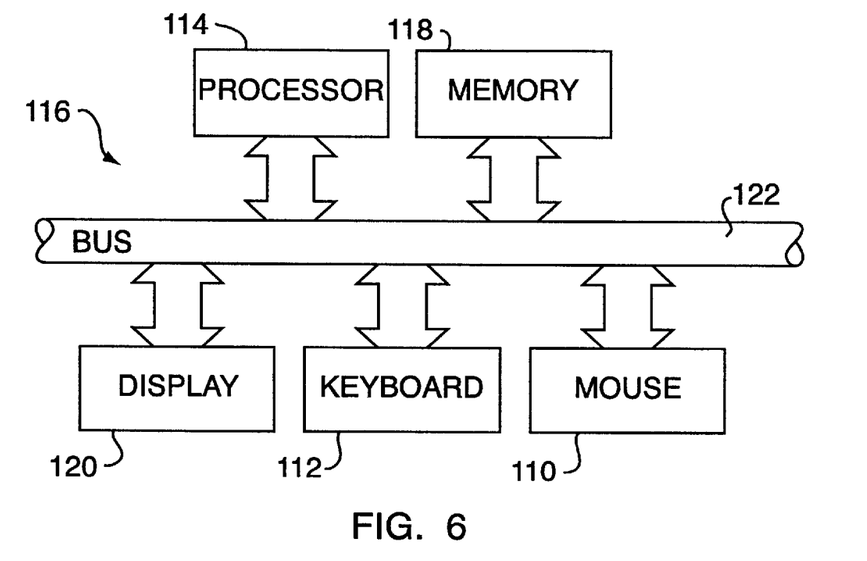
FIG. 6 is a block diagram of a workstation within which the program of FIG. 5 is implemented.

FIG. 5 is a flow chart of steps performed by an exemplary embodiment of the algorithm of the present invention which is embodied in the product model software program 10. The program code which embodies the product model software program 10 is preferably written in the proprietary ICAD object-oriented programming language, which is based on the industry standard LISP language. The program code executes on a computer processor 114 within a workstation 116, such as that illustrated in FIG. 6. The workstation 116 may also contain a memory 118 for storing program code and calculated data, a visual display screen 120 for displaying various information to the user along with the spline coupling model 20 after it has been created, and the keyboard 112 and the mouse 110 that are both used to input information to the computer processor 114 and memory 118. These various devices are connected together by a bus 122.

The product model software program 10 consists of electrical signals stored on a computer system, such as the workstation 116, which are processed by the processor 114 of the workstation. The spline coupling knowledge base included within the product model software program 10 are also signals stored on the computer system, as are the specifications and parameters stored within the knowledge base, and the geometric representations and the spline coupling model 20 created by the product model software program. Parameters are a variable or an arbitrary constant appearing in a mathematical expression or a computer program, each value of which restricts or determines the specific form of the expression. A parameter is broader and more general, than a specification. A specification is a entry or variable prescribing materials, dimensions, and workmanship for something to be built, installed, or manufactured. Specifications are a subset of parameters. A rule is a relationship between parameters, including specifications, such as a limit that a panel may not be more than 4 inches in length. Parameter values may be predefined in the spline coupling knowledge base or entered by a user.

Referring to FIGS. 4 and 5, in an enter step 300 in the flow chart, the user selects the directory pathname 124. The directory pathname 124 specifies a location within the workstation 116, or other computer, for the product model software program 10 to store output files, such as results of analysis programs and files to be input to CAD systems. The user may accept the default directory pathname 124 or the pathname may be changed by selecting a new pathname from a list of pathnames. The user may also accept the default identifier for the spline coupling files, or the identifier may be changed by entering a new name.

A common method for selecting filenames (and for other types of specification values, described hereinafter), is selecting from default values offered to the user on the main GUI screen 58. The default values are part of the knowledge base of specifications stored in the workstation 116 related to the spline coupling model 20 whose values are preprogrammed into the product model software program 10. Besides default values for specifications or attributes, the knowledge base may also store constraints on specification values. These specification constraints and default values may comprise either a single value or range of values. For example, a specification value may be greater than or less than a certain value. Also, the specification constraints and default values may be derived from mathematical equations. A specification constraint or default value can either be dependent or independent of other specifications.

Referring to FIGS. 3, 4 and 5, in a step 302, the user selects the Edit button 66 from the menu 60 displayed on the main GUI screen 58, and chooses a Spline Inputs and Configuration entry from the dropdown menu displayed on the main GUI screen. The Spline Inputs and Configuration GUI screen 80 is displayed to the user and contains spline coupling model 20 specification value input areas 126 and selection areas 128 as well the geometric representation 81 of the spline coupling model 20. Referring to FIGS. 4 and 5, in a step 304, the user selects from the Spline Inputs and Configuration GUI screen 80 the shoulder configuration specification 88 to be incorporated into the spline coupling model 20.

Referring to FIGS. 2 and 4, one type of shoulder configuration available for the spline coupling model 20 is a major snap out 132. Snaps 34 are the circumferential contact areas 34 between the external spline 40 and the internal spline 38 of the spline coupling model 20. The snaps 34 provide interference at two circumferential contact areas of the spline coupling model 20 to provide stability to reduce unwanted flexing of the spline coupling 30. To secure the internal spline 38 and the external spline 40 together, a diameter of the internal (or outer) spline at the snaps 34 is slightly smaller than a diameter of the external (or inner) spline at the snaps.

Still referring to the step 304, the snap 136 which has a larger diameter is defined as a major snap 54, while the snap 140 which has a smaller diameter is defined as a minor snap 56. The shoulder 36 of the spline coupling 30 is a radial area of either the internal spline 38 or the external spline 40 which is radially contacted by a relatively narrow area of the mating spline 38, 40. The shoulder 36 may be part of either the internal spline 38 or the external spline 40. The shoulder 36 establishes the maximum extent to which the internal spline 38 axially overlaps the external spline 40, and prevents the splines from overlapping further in the axial direction.

Continuing with FIGS. 2 and 4 and the step 304, the shoulder configuration specification 88 selection of major snap out 132 indicates that the location of the shoulder 36 is outboard 144 of the major snap 54 in the spline coupling model 20. In other words, the shoulder 36 of the spline coupling 30 is axially located on the opposite side of the major snap 54 from the spline coupling teeth 32. The shoulder configuration of the major snap out 132 has the internal spline 38 positioned over, or radially outside, the external spline 40 at the snap 34.

Figure 2B:
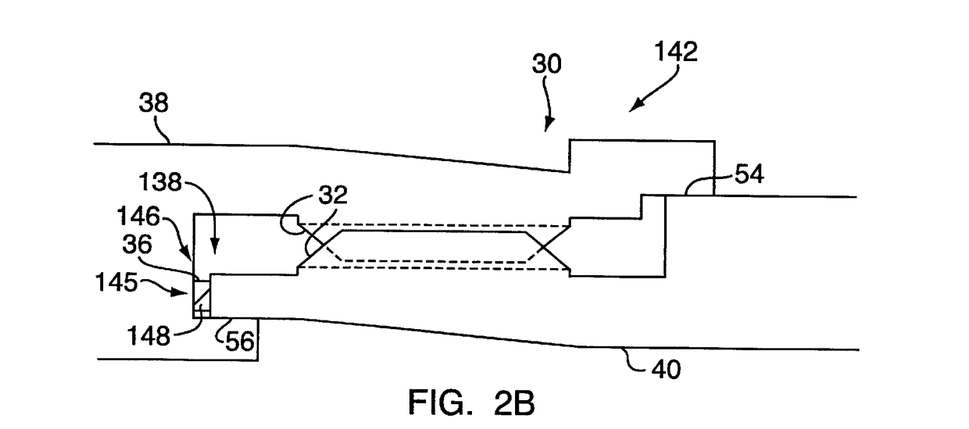
FIG. 2B is an partial, axial, cross sectional, schematic view of a third embodiment of a spline coupling.

As shown in FIG. 2B, another type of shoulder configuration is a minor snap out with inverted minor snap 142. The shoulder configuration of minor snap out with inverted snap 142 has many of the similar features as the shoulder configuration of the major snap out 132, and therefore the same reference numbers are used in FIG. 2B as in FIG. 2 for similar features. In the shoulder configurations of minor snap out with inverted snap 142, the internal spline 38 defines a slot 138 in which is positioned the external spline 40. The snap 34 is where the external spline 40 is positioned over, or radially outside, the internal spline 38 in the slot 138. The shoulder configuration specification 88 of minor snap out with inverted minor snap 142 indicates that the shoulder 36 is located outboard 145 of the minor snap 56, or is axially located on the opposite side of the minor snap from the spline coupling teeth 32.

Other types of shoulder configurations with similar features to the major snap out 132 and the minor snap out with inverted snap 142 include a major snap out with inverted minor snap, a major snap in, a minor snap out, and a minor snap in. The shoulder configuration specification 88 of major snap in indicates that the location of the shoulder 36 is on the inboard side of the major snap 54, or axially located between the major snap and the spline coupling teeth 32. The shoulder configuration specification 88 of minor snap in indicates that the shoulder 36 is located inboard of the minor snap 56, or axially located between the minor snap and the spline coupling teeth 32.

Continuing with FIG. 5, in conformance with the algorithm embodied in the product model software program 10, the user selects a number of dimensional specification values with respect to various location or physical attributes of the spline coupling model 20. Throughout program execution, various GUI screens 108, such as the Spline Input and Configuration GUI screen 80, guide the user while entering data and information. These GUI screens 108 display various model configuration and specification data value selections to the user, allowing the user to select a desired default specification data value, or to enter a desired specification data value. Many of the specifications of the spline coupling model 20 may be modified both by manipulating the spline coupling representations with the mouse 110, and by changing the values of the specifications with the keyboard 112.

The present invention contemplates that one of ordinary skill in the art will include someone with skill in designing spline couplings 30. Thus, the various attributes or specifications of the spline couplings 30, together with the values for these specifications, should be readily apparent to someone with such skill. Nevertheless, where appropriate, a discussion of various spline coupling 30 specifications or attributes, together with the manner of deriving certain default or derived values for these specifications, is provided herein.

Referring to FIG. 5, in a step 304, to continue configuring the spline coupling model 20 with the product model software program 10 in accordance with an embodiment of the algorithm of the present invention, the user enters the shoulder stack length specification 90, which may be zero. The shoulder stack length 146 is an axial length reserved for engine components, if present, such as bearings, which are stacked between the shoulder 36 of the spline coupling 30 and a radial mating face 148.

Similar to the other major structural features of the spline coupling model 20, the product model software program 10 of the present invention stores (as part of its knowledge base for the spline coupling model) a number of default values for various specifications for the internal spline 38 and the external spline 40. These specifications include various depths, thickness, widths, lengths, radii, and orientations.

Continuing with FIGS. 4 and 5, the user selects the Geometric Limits button 94 which is displayed on the Spline Inputs and Configuration GUI screen 80 and, in a step 310, enters the minimum shaft thickness specification and the spline coupling 30 inner diameter limit specification. In a step 312, the user enters spline coupling model 20 external spline 40 configuration specifications of an outer diameter limit 150 at the shoulder 36 and an outer diameter limit 152 at the major snap 54. In a step 314, the user enters the internal spline 38 specifications for an outer diameter limit 154 at the major snap 54 side of the internal spline tooth 48, and an outer diameter limit 156 at the minor snap 56 side of the internal spline tooth. Some of the spline coupling configuration specification values may optionally be displayed as color-coded boxes on the Spline Inputs and Configuration GUI screen 80 along with the geometric representation 81 of the spline coupling model 20.

It should be understood that these spline coupling specifications, and their order of entry into the product model software program 10, are purely exemplary. Instead, as should be readily apparent to one of ordinary skill in the art, spline coupling specifications may be entered into the spline coupling model 20 by the product model software program 10 in various order and arrangements by the user.

As shown in FIGS. 4 and 5, in a step 316, the user enters torque loads specifications 92 for the spline coupling model 20, such as a maximum torque 158 and a design point torque 160. The torque load performance requirement specifications 92 originate with higher level system designers, such as designers of shafts, turbines and compressors for a gas turbine engine (not shown). The spline coupling model 20 must meet these configuration and performance requirements.

Continuing with FIGS. 4 and 5, in a step 318, the user selects on the Spline Inputs and Configuration GUI screen 80 the Other Loads button 96, and in a step 320, enters performance requirement specifications for the internal spline 38 and the external spline 40 for the spline coupling model 20. The performance requirement specifications, in a step 322, include a separate maximum axial load and an axial load design point for the internal spline 38 and the external spline 40.

Performance requirement specifications indicate criteria that the physical spline coupling must meet, such as enduring a maximum torque. The product model software program 10 calculates the spline coupling configuration necessary to endure the performance requirements and creates the spline coupling model 20 based upon the geometric specifications of the spline coupling configuration. The spline coupling model 20 is stored on the workstation 116 for further modifications, testing or export.

Still referring to FIG. 5, in a step 324, the user enters major snap tooth moment performance requirement specifications separately for the internal spline 38 and the external spline 40, such as a blade loss moment, a polar moment, and a steady state bending moment. In a step 326, the user enters minor snap side of tooth moment performance requirement specifications separately for the internal spline 38 and the external spline 40, such as a blade loss moment, a polar moment, and a steady state bending moment.

Continuing with FIG. 5, in a step 328, the user enters design criteria for sizing the load carrying sections 162 of the second shaft 44 which includes the external spline 40 of the spline coupling model 30, such as torque margin performance requirement specifications for a yield limit, an elastic buckling, a plastic buckling and a creep buckling. In a step 330, a preexisting computerized analysis algorithm calculates the sizes of the load carrying sections of the second shaft 44 using the spline coupling model 20 performance requirement specifications and produces shaft configuration specifications. The shaft configuration specifications are automatically entered as specification values into product model software program 10 and incorporated into the spline coupling model 20.

Referring to FIGS. 4 and 5, in a step 332, the user selects the material specifications 100 for the spline coupling model 20 by selecting from a list of material specification values 164 for forming the internal spline 38 and the external spline 40. The material specification values 164 are included in the spline coupling knowledge base and are used by the product model software program 10 for creating the spline coupling model 20. The list of material specification values 164 are generated by a company's spline coupling designers based on company experience and preference regarding suitability for use in spline couplings 30 in terms of both manufacturing characteristics and performance characteristics.

Continuing to refer to FIGS. 4 and 5, and the step 332, the selection of materials for the list is based upon a balance between the cost of a material and the capability of the material, such as the difficulty of machining the material. The performance and physical characteristics, such as resistance to deformation and material density, and manufacturing characteristics, such as material strength, of the selected materials are incorporated into the spline coupling model 20 through the selection of the material specification values in the list of materials by the product model software program 10 in accordance with an embodiment of the present invention.

Still referring to FIGS. 4 and 5, in a step 334, the user selects the temperature performance requirement specifications 102 separately for the internal spline 38 and the external spline 40 from a list of temperatures 166 stored in the spline coupling knowledge base and displayed to the user by the product model software program 10. The spline coupling model 20 must be able to meet the performance requirement specifications 84 while enduring the selected temperature requirement specification 102 value.

Continuing with FIGS. 4 and 5, in a step 336, the user enters additional performance requirement specifications 84 for the spline coupling model 20 by selecting locations of maximum torque transfer 168 for the internal spline 38 and locations of maximum torque transfer 170 the external spline 40. Torque transfer is a function of the manner in which hardware is attached to the second shaft 44 and first shaft 42 joined by the spline coupling 30. The attaching hardware configuration, such as a low speed turbine (not shown), determines the location of the maximum torque. The user enters into product model software program 10 for incorporation into the spline coupling model 20 the location of the maximum torque based upon information obtained from higher level system designers. The algorithm of the present invention embodied in the product model software program 10 and the spline coupling knowledge base calculates the effects of newly entered or selected configuration and performance specification values on the configuration of the existing spline coupling model 20 and modifies the configuration specification values of the spline coupling model accordingly.

Continuing with the step 336, the user selects, for the internal spline 38, the performance requirement specifications torque transfer locations 168 of the major snap side 54, the minor snap side 56, or radial, meaning both sides of the internal spline tooth 48. The user also selects, for the external spline 40, the performance requirement specifications torque transfer locations 170 of the major snap side 54, the minor snap side 56, or radial, meaning both sides of the external spline tooth 46. The selection of the performance specification value of major snap side torque transfer 172 for the external spline 40 indicates that one hundred percent of torque occurs on the major snap side 54 of the external spline, and zero percent of torque occurs on the minor snap side 56 of the external spline.

Still referring to step 336, the selection of the performance specification value of minor snap side torque transfer 174 for the internal spline 38 indicates that one hundred percent of torque occurs on the minor snap side 56 of the internal spline, and zero percent of torque occurs on the major snap side 54 of the internal spline. Radial torque transfer 176 indicates that the torque transfer is one hundred percent on both sides of the tooth. The location of torque transfer for the internal spline 38 and the external spline 40 is indicated on the Spline Inputs and Configuration GUI screen 80 spline coupling geometric representation 81 by double headed arrows 178.

Referring to FIGS. 3 and 5, the user selects the Edit button 66 displayed on the main GUI screen 58, and chooses a Detail Spline Specifications entry from the dropdown menu displayed on the GUI screen. The Detail Spline Specifications GUI screen is displayed, and in a step 338, the user enters detailed spline specifications into the product model software program 10 for incorporation into the spline coupling model 20.

Referring to FIGS. 1 and 5, in a step 340, the user enters into the product model software program 10 the detailed spline specifications, including interface design specifications, for incorporation into the spline coupling model 20 in accordance with an embodiment of the present invention. The interface design specifications apply to both the internal spline 38 and the external spline 40 and include selecting a configuration specification value for a pressure angle 179 of the spline teeth 32, which is the angle 179 between a line 180 tangent to the tooth and a radial line 181 through the point of tangency. The user may select the pressure angle 179 of either 14.5 degrees or 30 degrees.

Continuing to refer to FIGS. 1 and 5 and the step 340, interface design specifications also include a diametral pitch if the pressure angle 179 is 14.5 degrees or a spline pitch if the pressure angle is 30 degrees. The diametral pitch is the number of spline teeth 32 per inch of pitch diameter 182, while the pitch diameter is the diameter of a pitch circle 184. The pitch circle 184 is a reference circle from which all transverse spline tooth dimensions are constructed. Interface design specifications also include a bury tooth specification to select whether the teeth 32 of one spline 38,40 are shorter than the teeth 32 of the mating spline 38,40.

Still referring to FIG. 5 and the step 340, the user enters further interface design specifications by selecting a sizing method to be used in creating the spline coupling model 20, which determines whether to optimize both the internal spline 38 and the external spline 40 or only one of the splines. The user also enters a tooth friction coefficient specification to be used for analysis for determining stresses in the spline coupling model 20. In addition, the user enters a pilot clearance specification, which is the diametral clearance between the tip 186 of the tooth 32 on one the splines 38, 40 to any feature on the mating spline 38, 40. Another specification entered by the user into the product model software program 10 is a root undercut diametral step, which provides clearance from the tooth root 189 to the undercut diameter 191. The root undercut diametral step also provides a well defined step so to prevent scarring of the undercut surface beyond the ends of the tooth.

Continuing with FIGS. 2 and 5 and the step 340, interface design specifications entered by the user include an end tooth angle 188 and a fillet radius for designing and manufacturing axial ends 190 of the spline tooth 32. The user also enters a tooth nominal bearing stress limit specification which is used to optimize an axial length 192 of each tooth 32. Generally, stress is distributed over the length of a spline tooth 32, allowing a longer spline tooth to endure more stress than a shorter spline tooth.

Still referring to FIGS. 2 and 5 and the step 340, the user enters a specification used to determine whether the calculated number of spline teeth 2 may be an odd number of teeth or whether the number of spline teeth are always an even number of teeth. It is easier to manufacture splines 38,40 with an even number of spline teeth 32, but the optimum spline coupling model 30 may have splines with an odd number of teeth, given predetermined performance specifications and configuration specifications 84.

Referring to FIG. 5 and a step 342, the user enters snap 34 and shoulder 36 detailed design specifications, including a height and a length of the shoulder. The snap 34 specifications for the major snap 54 include a snap length, an axial offset from the internal spline tooth 48, or an axial offset from the external spline tooth 46, whichever is applicable based upon the configuration chosen, a radial offset, an axial gap, and a snap fit. The snap 34 specifications for the minor snap 56 include a snap length, an axial offset from the internal spline tooth 48, or an axial offset from the external spline tooth 46, whichever is applicable based upon the configuration chosen, a radial offset, an axial gap, and a snap fit.

Referring to FIG. 4, the user may at any point click on the Warnings button 106, and display detailed information regarding any violations of the rules which have occurred. The Warnings button 106 appears only when a violation of a rule has occurred, and therefore the button's presence provides notice of a rule violation to the user. Warnings may be checked at any time, and any specifications which have violated a rule may be corrected at any time in any order desired by the user.

Figure 7:
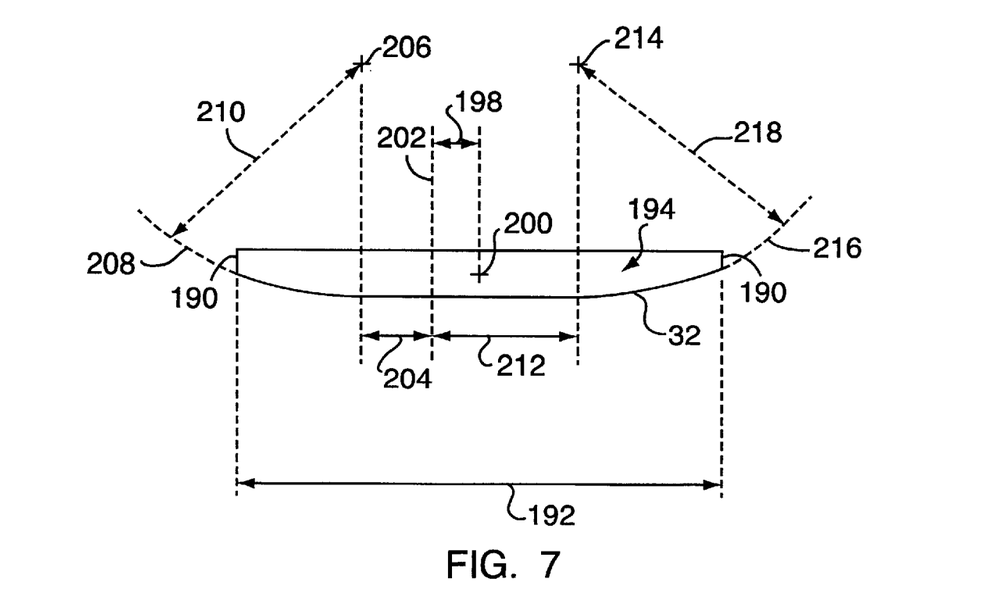
FIG. 7 is a top view schematic of a spline tooth as created by the product model software of FIG. 5.

Referring to FIGS. 5 and 7, in a step 344, the user enters tooth crown detailed design specifications to configure an axial profile of the spline teeth 32 and for exporting to an external computer program, such as ANSYS, for finite element stress analysis of spline teeth. The user enters a crowning specification to modify the axial profile of the spline tooth 32 to provide for a smooth distribution of stress across the spline tooth. Specifications which shape a crown 194 of the spline tooth 32 include: an axial length 198 between a tooth center 200 and a crown reference plane 202, an axial length 204 between the reference plane and a center 206 of a crown arc 208 on the major snap side 54, a length of a radius 210 of the crown arc on the major snap side, an axial length 212 between the reference plane and a center 214 of a crown arc 216 on the minor snap side 56, and a length of a radius 218 of the crown arc on the minor snap side.

As the user enters the detail spline specifications, the algorithm implemented by the product model software program 10 displays a summary of entered and calculated interface geometry specifications including a number of actual teeth 32 in each spline 38,40, a maximum number of teeth in each spline, the pitch diameter 182, and a tooth engagement length, which is the length of contact on each tooth between the internal spline 38 and the external spline 40. These specification values are calculated from the user-entered configuration and performance specifications, and from the stored default values and rules relating to various physical limits placed on the data values. Other configuration specifications include the diameter 154 of the spline coupling 30 at the major snap 54, the diameter 156 of the spline coupling at the minor snap 56, and an outer diameter limit 220 at the shoulder 36.

Referring to FIG. 5, in a step 346, the user enters or selects internal spline 38 design specifications, such as a tolerance class for a minimum effective space width and maximum effective internal spline tooth thickness limits. A lower tolerance class, for instance class 4, defines a finer fit, but costs more to manufacture than a higher tolerance class, such as class 5. The user also selects the shape of the shaft outer diameter of the internal spline tooth 48, such as tapered. For an internal spline 38 with teeth 48 with a pressure angle of 14.5 degrees, the user may enter a minimum root fillet radius of the internal spline tooth.

Continuing with FIG. 5, in a step 348, the user enters or selects external spline 40 design specifications such as a tolerance class for minimum effective space width and maximum effective external spline tooth thickness limits. A lower tolerance class, for instance class 4, defines a finer fit, but costs more to manufacture than a higher tolerance class, such as class 5. The user also selects the shape of the shaft inner diameter of the external spline tooth 46, such as tapered. For an external spline 40 with teeth 46 with a pressure angle of 14.5 degrees, the user may enter a minimum root fillet radius of the external spline tooth, and an external spline tooth thickness thinning factor.

Still referring to FIG. 5, in a step 350, the algorithm of the present invention embodied in the product model software program 10, and incorporated in the spline coupling model 20, displays a summary of the entered and calculated detail configuration specifications. The product model software program 10 prominently displays and highlights crucial design detail configuration specifications on GUI screens 108, such as a maximum diameter 220 of the spline coupling model 20 and the location of the maximum diameter. The maximum diameter 220 and location of the maximum diameter of the spline coupling model will vary depending upon the configuration and performance specifications, such as the shoulder configuration chosen by the user. For example the maximum diameter 220 for the spline coupling model 20 may be limited, for a major snap out configuration 132, by the external spline 40 outer diameter at the spline coupling shoulder 36.

Continuing to refer to FIG. 5 in the step 350, the algorithm of the present invention embodied in the product model software program 10, and incorporated in the spline coupling model 20, displays a summary of the entered and calculated detail configuration specifications. Configuration specifications which have been either entered into or calculated by the product model software program 10 for the internal spline 38 include a shaft outer diameter at the major snap side 54 of the internal spline tooth 48, a minimum shaft thickness at the major snap side of the internal spline tooth, an actual shaft thickness at the major snap side of the internal spline tooth, a shaft outer diameter at the minor snap side 56 of the internal spline tooth, a minimum shaft thickness at the minor snap side of the internal spline tooth, and an actual shaft thickness at the minor snap side of the internal spline tooth.

Continuing with FIG. 5 and the step 350, configuration specifications which have been either entered into or calculated by the product model software program 10 for the external spline 40 include a shaft inner diameter at the major snap side 54 of the external spline tooth 46, the minimum shaft thickness at the major snap side of the external spline tooth, the actual shaft thickness at the major snap side of the external spline tooth, the shaft inner diameter at the minor snap side 56 of the external spline tooth, a minimum shaft thickness at the minor snap side of the external spline tooth, and an actual shaft thickness at the minor snap side of the external spline tooth.

Referring to FIGS. 3 and 5, in a step 352, the user selects the Create button 68 from the main GUI screen 58 and, in a step 354, selects a geometric representation 81 of the spline coupling model 20, such as either a two dimensional representation or a line view representation, which requires little computation and display time. The product model software program 10 will display the spline coupling model 20 in the selected geometric representation 81 on the GUI screen 108, and will optionally also display geometric limits and reference lines. The user also selects whether to display either part of or the entire spline coupling model 20.

Referring to FIG. 5, in a step 356, the algorithm embodied in the product model software program 10 automatically calculates the various performance measurements of stress for the internal spline 38 and the external spline 40, such as a torsional windup measurement at the pitch diameter 182, using the entered and calculated performance and configuration specifications. A critical design factor is to minimize the difference in torsional windup measurement between the internal spline 38 and the external spline 40. Torsional windup is the twisting of a shaft under a torsional load, usually resulting in a maldistribution of torque transfer along the spline teeth 32 resulting in higher stresses in the spline teeth. The internal spline 38 and external spline 40 are different sizes, and could be formed of different material, therefore, the splines will not respond to torsional forces in an identical manner. If the difference, or delta, in the torsional windup measurement between the internal spline 38 and the external spline 40 is greater than 0.001 inches, a red warning is displayed on the Detail Spline Specifications GUI screen. The user should modify the spline coupling model 20 specifications to remove the cause of the warning since the spline coupling model does not meet required performance specifications.

Still referring to FIG. 5 and the step 356, additional performance measurements of stress which are calculated and displayed for each spline 38, 40 by the algorithm of the present invention embodied by the product model software program 10 include a maldistribution factor, which indicates how well the spline coupling teeth mesh, a nominal tooth bearing stress measurement, and a maximum principal stress measurement. A preexisting computerized tooth stress analysis algorithm calculates the nominal tooth bearing stress measurement and the maximum principal stress measurement using the spline coupling model 20 performance requirement specifications and configuration specifications. The nominal tooth bearing stress measurement and the maximum principal stress measurement are stored by the product model software program 10 and displayed on the Detail Spline Specification GUI screen. The utilization of the preexisting computerized tooth stress analysis is automatic and transparent to the user.

Continuing with FIG. 5 and step 356, the calculated performance measurements of stress utilize characteristics of the materials 164 selected by the user for forming the spline coupling model 20, such as material density and resistance to deformation. If characteristics of the selected material 164 which are necessary to calculate the performance measurements are not available to the product model software program 10, the product model software program 10 automatically substitutes, for performance stress measurement calculation purposes, another material which is stored in the knowledge database as having the same or similar manufacturing and performance characteristics as the selected material 164. The substituted material is displayed to the user on the Detail Spline Specification GUI screen.

Still referring to FIG. 5 and the step 356, a fatigue life measurement, or durability measurement, of the spline coupling model 20 is calculated by the product model software program 10 and displayed on the Detail Spline Specification GUI screen. The product model software program 10 calculates that a fatigue life measurement equaling 100,000 cycles satisfies the fatigue life performance requirement.

At this point, the user has completed entering the configuration and performance specifications relating to the various structural features of the spline coupling 30. The product model software program 10 creates an updated spline coupling model 20 whenever a specification is modified. As shown in the steps 350 and 356, the ICAD system allows the user to perform various types of engineering analyses on the spline coupling model 20 to assess various performance features of the spline coupling model. These analyses are automatically performed whenever a configuration or performance specification 84 is modified. In this way, the user can assess the viability of the design chosen for the spline coupling model 20.

Still referring to FIG. 5, in a step 358, the product model software program 10 automatically creates a spline coupling design report which is a text file that lists the various specifications relating to the physical features or elements of the spline coupling model 20 along with the values assigned to those specifications by the product model software program (including both user-selected specification values and pre-programmed default specification values). The report lists geometric configuration information about the spline coupling model 20 in terms of specification values for each feature. The design report file is automatically recreated whenever a spline coupling model 20 configuration or performance specification is modified.

The product model software program 10 also creates a non-parametric Unigraphics CAD input files for the spline coupling model 20. The non-parametric model created in the CAD system may not be easily altered, and so it is of limited use. However, drawings based on the model are useful, along with other functions of the Unigraphics system which are not provided by the ICAD system.

The product model software program 10 implemented in the ICAD system creates a valid, parametric, three-dimensional, geometric model 20 of the spline coupling using the user-input data verified against the knowledge base of configuration-dependent specification relationships and constraints stored in the product model software program 10 of the present invention. Continuing with FIG. 5, and a step 360, the parametric ANSYS interface input file that is output from the ICAD system may then be input into another computer program, such as the ANSYS stress analyzer program. This ICAD system file contains a listing of the spline coupling model 20 geometric configurations and specification data, and is known as an ANSYS Interface file. Other stress output files, which are created during the automatic analysis performed by the product model software program 10, are for auditing and cross checking purposes for evaluating the functioning of the product model software program.

The Unigraphics CAD system and the ANSYS computer program may be implemented within the same workstation 162 as that of the ICAD system. Still referring to FIG. 5, and in a step 362, ANSYS uses the ICAD system spline coupling model geometric data and commands in the ANSYS Interface files to generate, or recreate, a parametric model, similar to the parametric model of the spline coupling model 20 that is used within Unigraphics. The parametric model is used for finite element modeling to calculate stresses at any point in the spline coupling. Custom parametric models were created for each of the shoulder configurations of the spline coupling model 20 to output to ANSYS for stress analysis.

Referring to FIGS. 3 and 5, and in a step 364, the user selects the Info button 72 from the main GUI screen 58. In a step 366, the user selects a menu entry from the main GUI screen 58 to review either the ANSYS Interface file or the design report.

In further accord with the embodiment of the present invention, the product model software program 10 allows the user to modify any portion of the geometry of the spline coupling model 20. This can be done any time after the default model 20 geometry has been created by the ICAD system. If the user is not satisfied with the results of the ANSYS analysis or any other features of the spline coupling model 20, the user can return to any step in the design process to modify the model. When changing the various spline features, as previously noted, the program advises the user if any design rules have been violated such that the spline coupling may not be able to satisfy design requirements. The user may make the desired changes to the model in the steps 202 to 368. The resulting visual model may be viewed at any time and further modified, if desired. The program then ends in a step 370.

Although the present invention has been shown and described with respect to the detailed embodiments thereof, it will be understood by those skilled in the art that various changes in the form and detail thereof, such as applying the present invention to the design of other than aeronautic equipment, and implementing the present invention with other software besides the aforementioned expert system, may be made without departing from the broader aspects of the present invention.

What is claimed is:

1. A method of designing a spline coupling, comprising the steps of:

creating signals corresponding to a spline coupling knowledge base of information having a plurality of rule signals with respect to a corresponding plurality of parameter signals of associated elements of the spline coupling, wherein the spline coupling knowledge base comprises at least one data value signal for each one of the plurality of rule signals;

entering a desired data value signal for a selected one of the plurality of parameter signals of an associated element of the spline coupling;

comparing the entered desired data value signal for the selected one of the plurality of parameter signals with the corresponding at least one data value signal in the spline coupling knowledge base for the corresponding one of the plurality of rule signals; and creating signals representative of a geometric representation of the selected one of the plurality of parameter signals of the associated element of the spline coupling if the result of the step of comparing is such that the entered desired data value signal for the selected one of the plurality of parameter signals is determined to have a first predetermined relationship with respect to the corresponding at least one data value signal in the spline coupling knowledge base for the selected one of the plurality of rule signals, and wherein the plurality of rule signals include calculating a torsional windup difference signal, including the steps of:

calculating signals representative of a first spline and signals representative of a second spline for forming the spline coupling;

calculating signals representing a first torsional windup for the signals representing the first spline;

calculating signals representing a second torsional windup for the signals representing the second spline; and calculating a signal representing a torsional windup difference between the first torsional windup signals and the second torsional windup signals.

2. The method of claim 1, wherein the step of creating the signals representative of a geometric representation of the selected one of the plurality of parameter signals of the associated element of the spline coupling further comprises the step of updating signals representing the model of the spline coupling with the selected one of the plurality of parameter signals of the associated element of the spline coupling.

3. The method of claim 1, further comprising the step of modifying the entered desired data value signal for the selected one of the plurality of parameter signals if the result of the step of comparing is such that the entered desired data value signal for the selected one of the plurality of parameter signals is determined to have a second predetermined relationship with respect to the corresponding at least one data value signal in the spline coupling knowledge base for the selected one of the plurality of rule signals.

4. The method of claim 3, further comprising the steps of:

comparing the modified data value signal for the selected one of the plurality of parameter signals with the corresponding at least one data value signal in the spline coupling knowledge base for the corresponding one of the plurality of rule signals; and creating signals representative of a second geometric representation of the selected one of the plurality of parameter signals of the associated element of the spline coupling if the result of the step of comparing is such that the modified data value signal for the selected one of the plurality of parameter signals is determined to be of the first predetermined relationship with respect to the corresponding at least one data value signal in the spline coupling knowledge base for the corresponding one of the plurality of rule signals.

5. The method of claim 1, further comprising the step of storing the signals representative of the created spline coupling knowledge base of information.

6. The method of claim 1, further comprising the step of displaying the signals representative of the created geometric representation of the selected one of the plurality of parameter signals of the associated element of the spline coupling.

7. The method of claim 1, wherein the steps of calculating a torsional windup difference signal further include the step of displaying a warning signal if the torsional windup difference signal exceeds a performance requirement parameter signal.

8. The method of claim 1, wherein the plurality of rule signals include calculating signals representative of a size of a shaft which incorporates the spline coupling.

9. The method of claim 1, further comprising the step of analyzing the signals representing the created geometric representation of the selected one of the plurality of parameter signals of the spline coupling.

10. The method of claim 9, wherein the step of analyzing the signals representative of the created geometric representation of the selected one of the plurality of parameter signals of the spline coupling further comprises the step of performing a weight analysis on the signals representative of the created geometric representation of the selected one of the plurality of parameter signals of the spline coupling.

11. The method of claim 1, wherein the step of creating the signals representative of the geometric representation of the selected one of the plurality of parameter signals of the associated element of the spline coupling further comprises the step of creating signals representative of the model of the spline coupling.

12. The method of claim 1, wherein the at least one data value signal for each one of the plurality of rule signals in the spline coupling knowledge base comprises a numerical value.

13. The method of claim 1, wherein the at least one data value signal for each one of the plurality of rule signals in the spline coupling knowledge base comprises a range of values.

14. The method of claim 1, wherein the step of entering a desired data value signal for a selected one of the plurality of parameter signals of an associated element of the spline coupling further comprises the steps of:

presenting at least one data value signal for each one of the plurality of parameter signals of the associated element of the spline coupling; and selecting a desired data value signal for the selected one of the plurality of parameter signals of the associated element of the spline coupling from the presented at least one data value signal for each one of the plurality of parameter signals of the associated element of the spline coupling.

15. The method of claim 14, wherein the step of presenting at least one data value signal for each one of the plurality of parameter signals of the associated element of the spline coupling further comprises the step of providing a visual display containing a graphic depiction of the at least one data value signal for each one of the plurality of parameter signals of the associated element of the spline coupling.

16. The method of claim 1, further comprising the step of providing a file listing of a selected one or more of the plurality of parameter signals of the spline coupling, wherein the file listing includes at least one of the entered desired data value signals for each one of the corresponding plurality of parameter signals of the spline coupling, wherein the file listing represents a parametrical listing of each element of signals representing a model of the spline coupling.

17. The method of claim 16, wherein the step of providing a file listing of a selected one or more of the plurality of parameter signals of the spline coupling further comprises the step of providing the file listing as an output from a knowledge-based engineering system.

18. A computerized system for designing a spline coupling, comprising:

a spline coupling knowledge base including a plurality of design rule signals for generating spline coupling model configuration signals, wherein each of the design rule signals has a first relationship with at least one of a plurality of design parameter signals;

input means for receiving a design parameter value signal corresponding to one of the plurality of design parameter signals;

evaluation means for comparing the design parameter value signal with the plurality of design rule signals;

adjustment means for modifying spline coupling model configuration signals utilizing the design parameter value signal and the plurality of design rule signals;

creation means for generating signals representative of a geometric representation of the spline coupling model configuration signals; and stress means for calculating a torsional windup difference signal, wherein the stress means includes:

means for calculating signals representative of a first spline and signals representative of a second spline for forming the spline coupling;

means for calculating signals representing a first torsional windup for the signals representing the first spline;

means for calculating signals representing a second torsional windup for the signals representing the second spline; and means for calculating a signal representing a torsional windup difference between the first torsional windup signals and the second torsional windup signals.

19. The computerized system of claim 18, further including:

cautionary means for generating a warning signal if the design parameter value signal does not satisfy the plurality of the design rule signals; and means for displaying the warning signal.

20. The computerized system of claim 18, further including:

spline coupling material parameter signals received from the input means; and means for generating weight signals for the spline coupling model utilizing spline coupling material parameter signals and spline coupling model configuration signals.

21. The computerized system of claim 18, wherein the design parameter signals further include performance parameter signals for generating analysis signals of the spline coupling model configuration signals, and manufacturing parameter signals for establishing manufacturing constraints and preferences for the spline coupling model configuration signals.

22. The computerized system of claim 18, wherein the stress means further includes means for displaying a warning signal if the torsional windup difference signal exceeds a performance requirement design parameter signal.

* * * * *